United States Patent
Nishio et al.

(10) Patent No.: US 9,318,324 B2
(45) Date of Patent: Apr. 19, 2016

(54) MANUFACTURING METHOD OF SIC EPITAXIAL SUBSTRATE, MANUFACTURING METHOD OF SEMICONDUCTOR DEVICE, AND SEMICONDUCTOR DEVICE

(71) Applicant: Kabushiki Kaisha Toshiba, Minato-ku (JP)

(72) Inventors: Johji Nishio, Machida (JP); Chiharu Ota, Kawasaki (JP); Ryosuke Iijima, Setagaya (JP); Tatsuo Shimizu, Shinagawa (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/656,937

(22) Filed: Mar. 13, 2015

(65) Prior Publication Data
US 2015/0270128 A1  Sep. 24, 2015

(30) Foreign Application Priority Data

Mar. 19, 2014 (JP) .................................. 2014-057277

(51) Int. Cl.
*H01L 29/15* (2006.01)
*H01L 31/0312* (2006.01)
(Continued)

(52) U.S. Cl.
CPC ...... *H01L 21/02529* (2013.01); *H01L 21/0262* (2013.01); *H01L 21/02378* (2013.01); *H01L 21/02447* (2013.01); *H01L 21/02507* (2013.01); *H01L 21/02576* (2013.01); *H01L 21/26513* (2013.01); *H01L 29/1608* (2013.01)

(58) Field of Classification Search
CPC ............... H01L 21/02529; H01L 21/02507; H01L 21/02447; H01L 21/02378; H01L 21/02576; H01L 21/0262; H01L 29/1608; H01L 21/26513
See application file for complete search history.

(56) References Cited

U.S. PATENT DOCUMENTS

| 6,133,120 A | 10/2000 | Miyajima et al. |
| 2006/0022292 A1* | 2/2006 | Shenoy ............... H01L 21/0495 257/472 |

(Continued)

FOREIGN PATENT DOCUMENTS

| EP | 2 570 522 A1 | 3/2013 |
| JP | 09-063968 A | 3/1997 |

(Continued)

OTHER PUBLICATIONS

U.S. Appl. No. 14/614,699, filed Feb. 5, 2015, Nishio, et al.
(Continued)

*Primary Examiner* — Thanh Y Tran
(74) *Attorney, Agent, or Firm* — Oblon, McClelland, Maier & Neustadt, L.L.P.

(57) ABSTRACT

A manufacturing method of an SiC epitaxial substrate of an embodiment includes performing a first and a second process alternately to form an n type SiC layer, the first process forming a first SiC layer with an epitaxial growth process by using a first source gas containing an n type impurity, and the second process forming a second SiC layer with an epitaxial growth process by using a second source gas containing the n type impurity, the second source gas having a higher atomic ratio between C (carbon) and Si (silicon) (C/Si) than that of the first source gas, a thickness of the second SiC layer being smaller than a thickness of the first SiC layer.

10 Claims, 9 Drawing Sheets

(51) Int. Cl.
*H01L 21/02* (2006.01)
*H01L 21/265* (2006.01)
*H01L 29/16* (2006.01)

(56) References Cited

U.S. PATENT DOCUMENTS

| | | | |
|---|---|---|---|
| 2010/0119849 A1* | 5/2010 | Nakamura | C30B 25/20 428/446 |
| 2011/0018005 A1* | 1/2011 | Nakano | H01L 21/046 257/77 |
| 2011/0031505 A1 | 2/2011 | Harada et al. | |
| 2013/0049014 A1 | 2/2013 | Aigo et al. | |
| 2014/0034966 A1 | 2/2014 | Nishio et al. | |

FOREIGN PATENT DOCUMENTS

| | | |
|---|---|---|
| JP | 2008-074664 A | 4/2008 |
| JP | 2009-164571 A | 7/2009 |
| JP | 2009-256138 A | 11/2009 |
| JP | 2011-236085 A | 11/2011 |
| JP | 2014-029952 A | 2/2014 |

OTHER PUBLICATIONS

U.S. Appl. No. 14/690,968, filed Apr. 20, 2015, Nishio, et al.
Extended European Search Report issued Jul. 31, 2015 in Patent Application No. 15152896.5.
Toshiya Yokogawa, et al., "Electronic Properties of Nitrogen Delta-Doped Silicon Carbide Layers" Materials Research Society Symposium Proceedings, vol. 640, XP008010057, 2001, pp. H2.5.1-H2.5.6.
K. Kojima et al., "4H-SiC Carbon-Face Epitaxial Layers Grown by Low-Pressure Hot-Wall Chemical Vapor Deposition" Materials Science Forum, vol. 457-460, XP055169649, 2004, 5 Pages.
Kazutoshi Kojima, et al., "Epitaxial Growth of High-Quality 4H-SiC Carbon-Face by Low-Pressure Hot-Wall Chemical Vapor Deposition" Japanese Journal of Applied Physics, vol. 42, Part 2, No. 6B, XP001047877, Jun. 15, 2003, pp. L637-L639.
Toru Hiyoshi, et al., "Reduction of Deep Levels and Improvement of Carrier Lifetime in n-Type 4H—SiC by Thermal Oxidation" Applied Physics Express 2, 2009, pp. 041101-1-041101-3.
Liutauras Storasta, et al., "Reduction of traps and improvement of carrier lifetime in 4 H—Si C epilayers by ion implantation" Applied Physics Letters 90, 2007, 4 Pages.

* cited by examiner

MANUFACTURING METHOD OF SIC EPITAXIAL SUBSTRATE, MANUFACTURING METHOD OF SEMICONDUCTOR DEVICE, AND SEMICONDUCTOR DEVICE

CROSS-REFERENCE TO RELATED APPLICATION

This application is based upon and claims the benefit of priority from Japanese Patent Application No. 2014-057277, filed on Mar. 19, 2014, the entire contents of which are incorporated herein by reference.

FIELD

Embodiments described herein relate generally to a manufacturing method of an SiC epitaxial substrate, a manufacturing method of a semiconductor device, and a semiconductor device.

BACKGROUND

SiC (silicon carbide) has been expected to be used as a material for a next-generation semiconductor device. Compared to Si (silicon), SiC has more excellent physical properties, i.e., SiC has three times as much bandgap as Si, about ten times as much breakdown field strength as Si, and about three times as much thermal conductivity as Si. A semiconductor device having low energy loss and operable at high temperature can be realized by utilizing such properties.

On the other hand, n-type SiC has a disadvantage of a short lifetime of a minority carrier. Reduction in an on resistance of a bipolar device using n-type SiC for a drift layer is difficult due to a short lifetime of a minority carrier.

DETAILED DESCRIPTION

Figure 1:
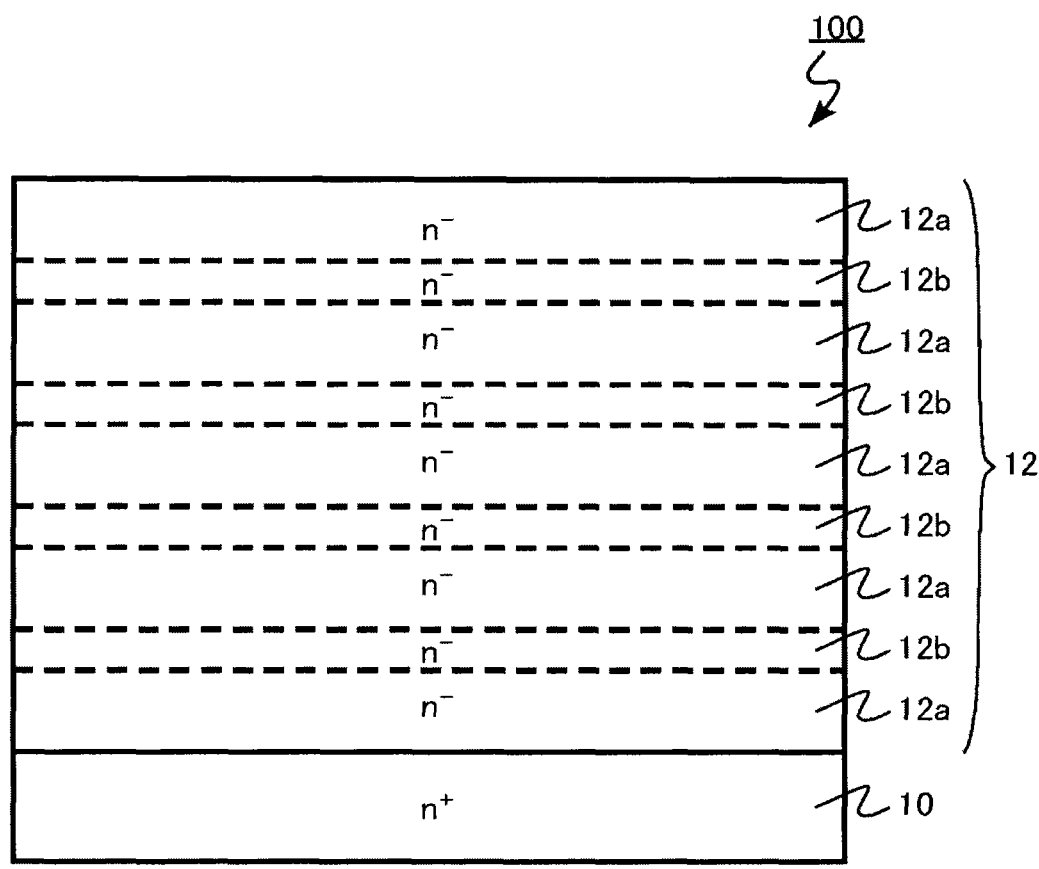
FIG. 1 is a schematic sectional view illustrating an SiC epitaxial substrate manufactured by a manufacturing method of an SiC epitaxial substrate according to a first embodiment.

A manufacturing method of an SiC epitaxial substrate according to an embodiment includes performing a first process and a second process alternately to form an n type SiC layer, the first process forming a first SiC layer with an epitaxial growth process by using a first source gas containing an n type impurity, and the second process forming a second SiC layer with an epitaxial growth process by using a second source gas containing the n type impurity, the second SiC layer being formed with a higher ratio (C/Si) between a number of atoms of C (carbon) and a number of atoms of Si (silicon) contained in the source gas than a ratio (C/Si) between a number of atoms of C (carbon) and a number of atoms of Si (silicon) contained in the source gas upon forming the first SiC layer, and with a thickness smaller than the thickness of the first SiC layer.

Embodiments of the present disclosure will be described below with reference to the drawings. In the description below, the same components are identified by the same reference numerals, and the description for the component once described before may not be repeated accordingly.

$n^+$, n, and $n^-$, and $p^+$, p, and $p^-$ described in the description below represent a relative impurity concentration in each conductive type. Specifically, $n^+$ represents that a concentration of n type impurities is relatively higher than n, and $n^-$ represents that a concentration of n type impurities is relatively lower than n. Similarly, $p^+$ represents that a concentration of p type impurities is relatively higher than p, and $p^-$ represents that a concentration of p type impurities is relatively lower than p. Notably, an $n^+$ type and $n^-$ type are sometimes merely referred to as an n type, and a $p^+$ type and $p^-$ type are sometimes merely referred to as a p type.

First Embodiment

A manufacturing method of an SiC epitaxial substrate according to the present embodiment includes performing a first process and a second process alternately to form an n type SiC layer, the first process being performed to form a first SiC layer with an epitaxial growth process by using a first source gas containing an n type impurity, and the second process being performed to form a second SiC layer with an epitaxial growth process by using a second source gas containing the n type impurity, the second SiC layer being formed with a higher atomic ratio (C/Si) between a number of atoms of C (carbon) and a number of atoms of Si (silicon) contained in the source gas than an atomic ratio (C/Si) between a number of atoms of C (carbon) and a number of atoms of Si (silicon) contained in the source gas upon forming the first SiC layer, and with a thickness smaller than the thickness of the first SiC layer.

FIG. 1 is a schematic sectional view illustrating an SiC epitaxial substrate manufactured by a manufacturing method of an SiC epitaxial substrate according to the present embodiment. An SiC epitaxial substrate 100 is an SiC epitaxial wafer, for example.

In the manufacturing method of the SiC epitaxial substrate 100 according to the present embodiment, an SiC substrate 10 is firstly prepared. The SiC substrate 10 is an $n^+$ single-crystal SiC substrate. For example, the SiC substrate 10 is a 4H-SiC substrate whose surface tilts at an off angle ranging from 0.2 degrees or more to 10 degrees or less from (0001) face.

An n type impurity is N (nitrogen), for example, and an impurity concentration is $5 \times 10^{17}$ $cm^{-3}$ or more but $5 \times 10^{19}$ $cm^{-3}$ or less. The thickness of the SiC substrate 10 is 100 μm or more but 400 μm or less, for example.

Next, an n type SiC layer 12 is formed on the SiC substrate 10 with an epitaxial growth process. As illustrated in FIG. 1, the n type SiC layer 12 is formed by alternately stacking each of two or more low-carbon-concentration SiC layers (first SiC layer) 12a and each of two or more high-carbon-concentration SiC layers (second SiC layer) 12b. FIG. 1 illustrates that five low-carbon-concentration SiC layers 12a and four high-carbon-concentration SiC layers 12b are stacked. However, the number of layers is not limited thereto.

The n type SiC layer 12 contains N (nitrogen) as an n type impurity. The impurity concentration of the n type SiC layer 12 is $1\times10^{15}$ cm$^{-3}$ or more but $5\times10^{16}$ cm$^{-3}$ or less. The thickness of the n type SiC layer 12 is 5 μm or more but 100 μm or less, for example.

The n type SiC layer 12 can be formed by using a known epitaxial growth device.

Upon forming the n type SiC layer 12, the low-carbon-concentration SiC layer (first SiC layer) 12a is firstly formed (first process). The low-carbon-concentration SiC layer 12a is formed by using a source gas (first source gas) containing n type impurity, e.g., N (nitrogen), with an epitaxial growth process.

The source gas for Si (silicon) upon forming the low-carbon-concentration SiC layer 12a is monosilane (SiH$_4$) using hydrogen gas (H$_2$) as carrier gas, for example. The source gas for C (carbon) is propane (C$_3$H$_8$) using hydrogen gas as carrier gas, for example. The source gas for N (nitrogen) that is the n type impurity is nitrogen gas (N$_2$) diluted with hydrogen gas, for example.

The ratio (C/Si) between the number of atoms of C (carbon) and the number of atoms of Si (silicon) contained in the source gas flown in a unit time upon forming the low-carbon-concentration SiC layer 12a is desirably 0.9 or more but 1.2 or less. The ratio (C/Si) of number of atoms can be adjusted by controlling a flow rate of the source gas for C (carbon) and a flow rate of the source gas for Si (silicon) flown upon forming the low-carbon-concentration SiC layer 12a.

When the ratio (C/Si) of number of atoms becomes less than 0.9, C (carbon) in SiC becomes insufficient, resulting in that a carbon vacancy is likely to excessively increase. When the ratio (C/Si) of number of atoms exceeds 1.2, C (carbon) in SiC increases. Especially when the thickness is increased, a crystalline property might be deteriorated, for example, a surface morphology might be deteriorated.

A growth speed of the low-carbon-concentration SiC layer 12a upon forming the low-carbon-concentration SiC layer 12a is desirably 5 μm/h or more but 20 μm/h or less. When the growth speed becomes less than 5 μm/h, the growth time becomes too long, which might increase manufacturing cost. When the growth speed exceeds 20 μm/h, a crystalline property might be deteriorated, for example, a surface morphology might be deteriorated, especially when the thickness is increased.

The thickness of the low-carbon-concentration SiC layer 12a is 0.5 μm or more but 10 μm or less, for example.

The growth temperature of the low-carbon-concentration SiC layer 12a is desirably 1550° C. or higher but 1650° C. or lower. When the growth temperature becomes lower than 1550° C., diffusion of interstitial carbon might be insufficient. When the growth temperature exceeds 1650° C., a carbon vacancy is likely to increase.

After the formation of the low-carbon-concentration SiC layer 12a, the high-carbon-concentration SiC layer 12b is formed on the low-carbon-concentration SiC layer 12a.

The high-carbon-concentration SiC layer (second SiC layer) 12b is formed by using source gas (second source gas) containing n type impurities, e.g., N (nitrogen), with an epitaxial growth process (second process). For example, the high-carbon-concentration SiC layer 12b is formed by changing the flow rate of the source gas upon forming the low-carbon-concentration SiC layer 12a.

The source gas for Si (silicon) upon forming the high-carbon-concentration SiC layer 12b is monosilane (SiH$_4$) using hydrogen gas (H$_2$) as carrier gas, for example. The source gas for C (carbon) is propane (C$_3$H$_8$) using hydrogen gas as carrier gas, for example. The source gas for N (nitrogen) that is the n type impurity is nitrogen gas (N$_2$) diluted with hydrogen gas, for example.

The ratio (C/Si) between the number of atoms of C (carbon) and the number of atoms of Si (silicon) contained in the source gas flown in a unit time upon forming the high-carbon-concentration SiC layer 12b is set higher than the ratio (C/Si) between the number of atoms of C (carbon) and the number of atoms of Si (silicon) contained in the source gas flown in a unit time upon forming the low-carbon-concentration SiC layer 12a. With this, the amount of C (carbon) in the film just after the deposition of the high-carbon-concentration SiC layer 12b becomes higher than the amount of C (carbon) in the film just after the deposition of the low-carbon-concentration SiC layer 12a.

The ratio (C/Si) between the number of atoms of C (carbon) and the number of atoms of Si (silicon) contained in the source gas flown in a unit time upon forming the high-carbon-concentration SiC layer 12b is desirably 1.5 or more but 2.5 or less. The ratio (C/Si) of number of atoms can be adjusted by controlling a flow rate of the source gas for C (carbon) and a flow rate of the source gas for Si (silicon) flown upon forming the high-carbon-concentration SiC layer 12b.

When the ratio (C/Si) of number of atoms becomes less than 1.5, C (carbon) in the finally formed SiC layer 12 becomes insufficient, resulting in a possibility that a carbon vacancy cannot sufficiently be reduced. When the ratio (C/Si) of number of atoms exceeds 2.5, C (carbon) in SiC increases. Especially when the thickness is increased, a crystalline property might be deteriorated, for example, a surface morphology might be deteriorated. The ratio (C/Si) of number of atoms is desirably larger than 2.0 from the viewpoint of sufficiently reducing a carbon vacancy in the finally formed SiC layer 12.

The growth speed of the high-carbon-concentration SiC layer 12b upon forming the high-carbon-concentration SiC layer 12b is desirably lower than the growth speed of the low-carbon-concentration SiC layer 12a from the viewpoint of enhancing crystalline properties of the high-carbon-concentration SiC layer 12b. The growth speed of the high-carbon-concentration SiC layer 12b upon forming the high-carbon-concentration SiC layer 12b is desirably 5 μm/h or more but 10 μm/h or less. When the growth speed becomes less than 5 μm/h, the growth time becomes too long, which might increase manufacturing cost. When the growth speed exceeds 10 μm/h, crystalline properties might be deteriorated, for example, a surface morphology might be deteriorated, especially when the thickness is increased.

The thickness of the high-carbon-concentration SiC layer 12b is smaller than the thickness of the low-carbon-concentration SiC layer 12a. This relation is established to increase the entire thickness of the finally formed SiC layer 12, to keep satisfactory crystalline properties, and to sufficiently reduce a carbon vacancy.

The thickness of the high-carbon-concentration SiC layer 12b is 0.1 μm or more but 2 μm or less, for example. When the thickness becomes smaller than 0.1 μm, C (carbon) in the finally formed SiC layer 12 becomes insufficient, resulting in a possibility that a carbon vacancy cannot sufficiently be reduced. When the thickness exceeds 2 μm, crystalline properties might be deteriorated, for example, a surface morphology might be deteriorated, especially when the thickness is increased.

The growth temperature of the high-carbon-concentration SiC layer 12b is desirably 1550° C. or higher but 1650° C. or lower. When the growth temperature becomes lower than 1550° C., diffusion of interstitial carbon might be insufficient. When the growth temperature exceeds 1650° C., a carbon vacancy is likely to increase.

The amount of the n type impurities contained in the source gas upon forming the high-carbon-concentration SiC layer 12b is desirably larger than the amount of the n type impurities contained in the source gas upon forming the low-carbon-concentration SiC layer 12a. As the ratio (C/Si) of number of atoms in the source gas becomes higher, N (nitrogen) that is the n type impurity is more difficult to be introduced into the film. Accordingly, the above relation is desirably satisfied from the viewpoint of generating a uniform distribution of the n type impurities in the finally formed SiC layer 12.

After the formation of the high-carbon-concentration SiC layer 12b, the formation of the low-carbon-concentration SiC layer 12a and the formation of the high-carbon-concentration SiC layer 12b are repeated desired number of times, whereby the n type SiC layer 12 is formed.

The concentration distribution of C (carbon) in the finally formed SiC layer 12 is considered to be uniform at the stage where all films are formed, because of thermal energy upon forming the SiC layer 12. The concentration distribution of N (nitrogen) that is the n type impurity in the finally formed SiC layer 12 is considered to be uniform at the stage where all films are formed, because of thermal energy upon forming the SiC layer 12.

The layer formed first on the surface of the SiC substrate 10 is desirably the low-carbon-concentration SiC layer 12a that is easy to provide satisfactory crystalline properties. The layer finally formed on the SiC layer 12, i.e., the layer on the uppermost surface of the SiC layer 12, is also desirably the low-carbon-concentration SiC layer 12a that is easy to provide satisfactory crystalline properties. The reason of this is that the uppermost surface of the SiC layer 12 becomes a device formation region, when a device is formed by using the SiC epitaxial substrate according to the present embodiment.

The manufacturing conditions for the respective low-carbon-concentration SiC layers 12a are not necessarily the same. The manufacturing conditions for the respective high-carbon-concentration SiC layers 12b are similarly not necessarily the same.

The function and effect of the manufacturing method of the SiC epitaxial substrate according to the present embodiment will be described next.

n type SiC has a disadvantage of a short lifetime of a minority carrier, compared to n type Si. When the lifetime of the minority carrier is short, conductivity modulation in a drift layer becomes insufficient in a bipolar device using n type SiC for the drift layer. Therefore, the reduction in an on resistance of the device becomes difficult.

One of conceivable factors for the short lifetime of the minority carrier is a carbon vacancy in n type SiC. Specifically, the carbon vacancy becomes a killer center for holes, so that the lifetime of holes is decreased. It is accordingly considered that the lifetime of holes is increased by reducing the carbon vacancy in n type SiC.

In the present embodiment, upon forming the n type SiC layer 12, each of the plural low-carbon-concentration SiC layers 12a and each of the plural high-carbon-concentration SiC layers 12b are alternately stacked. The ratio (C/Si) between the number of atoms of C (carbon) and the number of atoms of Si (silicon) in the high-carbon-concentration SiC layer 12b just after the deposition is higher than a stoichiometry of SiC. In other words, the amount of interstitial C (carbon) is large.

Due to thermal energy during the formation of the n type SiC layer 12, interstitial C (carbon) in the high-carbon-concentration SiC layer 12b is diffused to reduce the carbon vacancy in the low-carbon-concentration SiC layer 12a. Upon the completion of the formation of the n type SiC layer 12, the distribution of C (carbon) becomes uniform, whereby the n type SiC layer 12 in which the carbon vacancy is reduced as a whole is formed.

In an SiC layer having large amount of C (carbon), crystalline properties is likely to be deteriorated, for example, the surface morphology is likely to be deteriorated, compared to an SiC layer having less C (carbon). Especially when the thickness is increased, or when the growth speed is high, this tendency becomes noticeable.

In view of this, the thickness of the high-carbon-concentration SiC layer 12b is set smaller than the thickness of the low-carbon-concentration SiC layer 12a in the present embodiment. The growth speed of the high-carbon-concentration SiC layer 12b is desirably set lower than the growth speed of the low-carbon-concentration SiC layer 12a.

In the present embodiment, to attain a uniform concentration of the n type impurities in the n type SiC layer 12, n type impurities are contained in source gas for forming the low-carbon-concentration SiC layer 12a and the high-carbon-concentration SiC layer 12b.

From the viewpoint of reducing a carbon vacancy, attaining satisfactory crystalline properties, and enhancing productivity, the total thickness of the high-carbon-concentration SiC layers 12b in the n type SiC layer 12 is desirably smaller than the total thickness of the low-carbon-concentration SiC layers 12a.

Conceivable methods for reducing a carbon vacancy in n type SiC include a method of thermally oxidizing the surface of n type SiC at a high temperature of about 1300° C., for example. In the present embodiment, an additional process such as thermal oxidization at high temperature is unnecessary.

Conceivable methods for reducing a carbon vacancy in n type SiC also include a method of implanting C (carbon) ions from the surface of n type SiC, for example. In the present embodiment, a carbon vacancy can effectively be reduced even in thick n type SiC into which C (carbon) is difficult to be implanted by ion implantation.

According to the manufacturing method of an SiC epitaxial substrate according to the present embodiment, an SiC epitaxial substrate that can reduce on resistance of a bipolar device can be manufactured.

Second Embodiment

A manufacturing method of a semiconductor device according to the present embodiment includes performing a first process and a second process alternately to form an n type SiC layer, the first process being performed to form a first SiC layer with an epitaxial growth process by using a first source gas containing an n type impurity, and the second process being performed to form a second SiC layer with an epitaxial growth process by using a second source gas containing an n type impurity, the second SiC layer being formed with a higher ratio (C/Si) between a number of atoms of C (carbon) and a number of atoms of Si (silicon) contained in the source gas than a ratio (C/Si) between a number of atoms of C (carbon) and a number of atoms of Si (silicon) contained in the source gas upon forming the first SiC layer, and with a thickness smaller than the thickness of the first SiC layer.

A manufacturing method of a semiconductor device according to the present embodiment uses the manufacturing method of an SiC epitaxial substrate according to the first embodiment. Therefore, the description overlapping the first embodiment will not be repeated.

Figure 2:
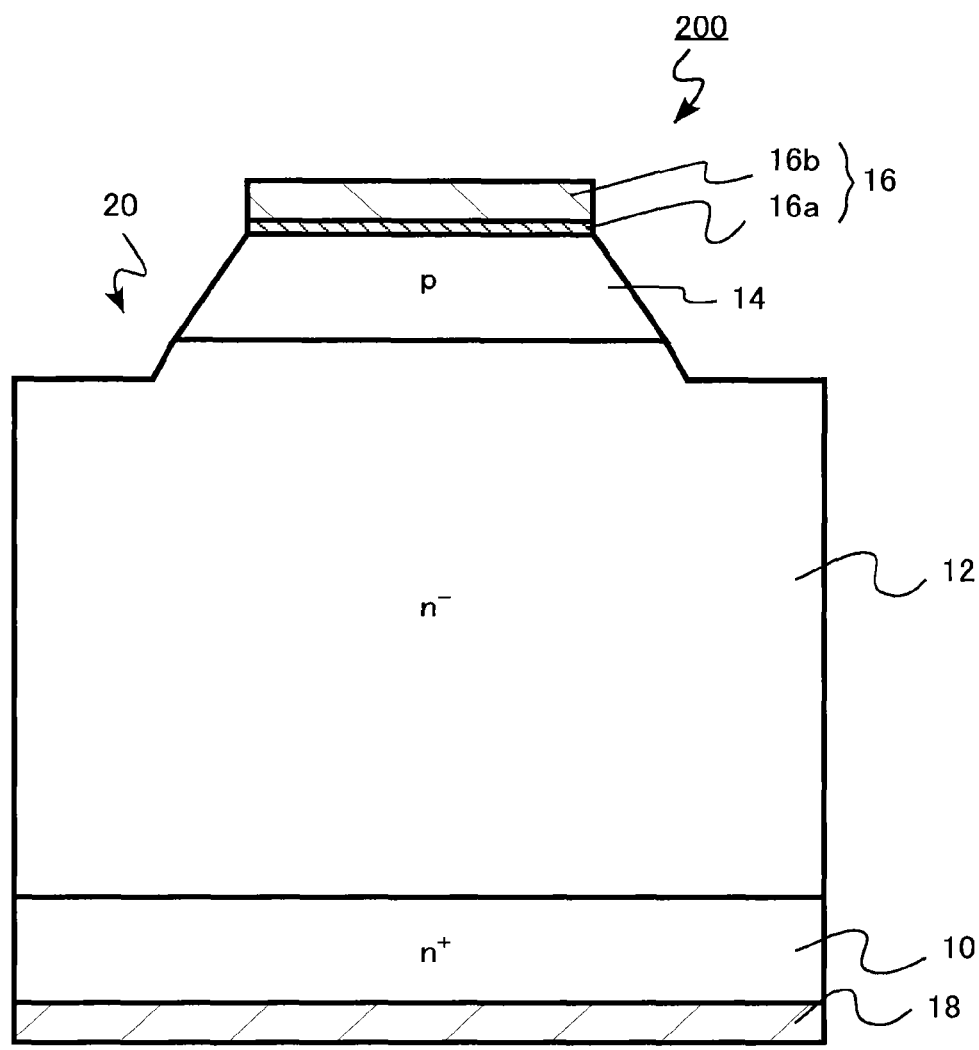
FIG. 2 is a schematic sectional view illustrating a semiconductor device manufactured by a manufacturing method of a semiconductor device according to a second embodiment.

FIG. 2 is a schematic sectional view illustrating a semiconductor device manufactured by the manufacturing method of a semiconductor device according to the present embodiment. A semiconductor device 200 according to the present embodiment is a mesa PIN diode.

This PIN diode 200 includes an SiC substrate 10. The SiC substrate 10 is an n$^+$ single crystalline SiC substrate. For example, the SiC substrate 10 is a 4H-SiC substrate whose surface tilts at an off angle ranging from 0.2 degrees or more to 10 degrees or less from (0001) face.

An n type SiC layer 12 is formed on the SiC substrate 10. The n type SiC layer 12 is an epitaxial growth layer. The n type SiC layer 12 is a drift layer of the PIN diode 200.

The n type SiC layer 12 contains N (nitrogen) as an n type impurity, for example. The impurity concentration of the n type SiC layer 12 is $1 \times 10^{15}$ cm$^{-3}$ or more but $5 \times 10^{16}$ cm$^{-3}$ or less. The thickness of the n type SiC layer 12 is 5 μm or more but 100 μm or less, for example.

A p type SiC layer 14 containing p type impurities is formed on the n type SiC layer 12. The p type SiC layer 14 is an epitaxial growth layer.

The p type SiC layer 14 contains Al (aluminum) as a p type impurity, for example, and the impurity concentration is $1 \times 10^{16}$ cm$^{-3}$ or more but $1 \times 10^{22}$ cm$^{-3}$ or less. The thickness of the p type SiC layer 14 is 0.2 μm or more but 3 μm or less, for example.

The PIN diode 200 includes a conductive anode electrode 16 electrically connected to the p type SiC layer 14. The anode electrode 16 includes an Ni (nickel) barrier metal layer 16a and an Al (aluminum) metal layer 16b on the barrier metal layer 16a.

A conductive cathode electrode 18 is formed on a back surface of the SiC substrate 10. The cathode electrode 18 is made of Ni (nickel), for example.

The PIN diode 200 is formed with a trench 20 formed on both sides of the anode electrode 16 so as to reach the n type SiC layer 12 from the surface of the p type SiC layer 14. The trench 20 is buried with an oxide film not illustrated, for example. The formation of the trench 20 can reduce leak current, whereby high breakdown voltage PIN diode 200 can be realized.

Figure 3:
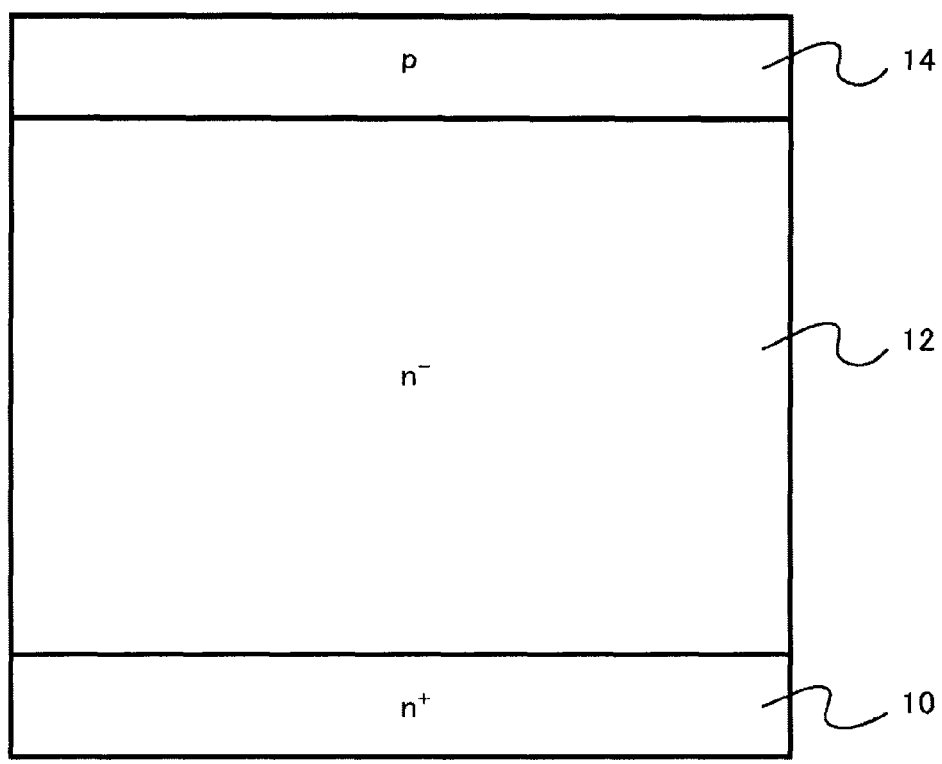
FIG. 3 is a schematic sectional view illustrating the semiconductor device during the manufacturing method of a semiconductor device according to the second embodiment.
Figure 4:
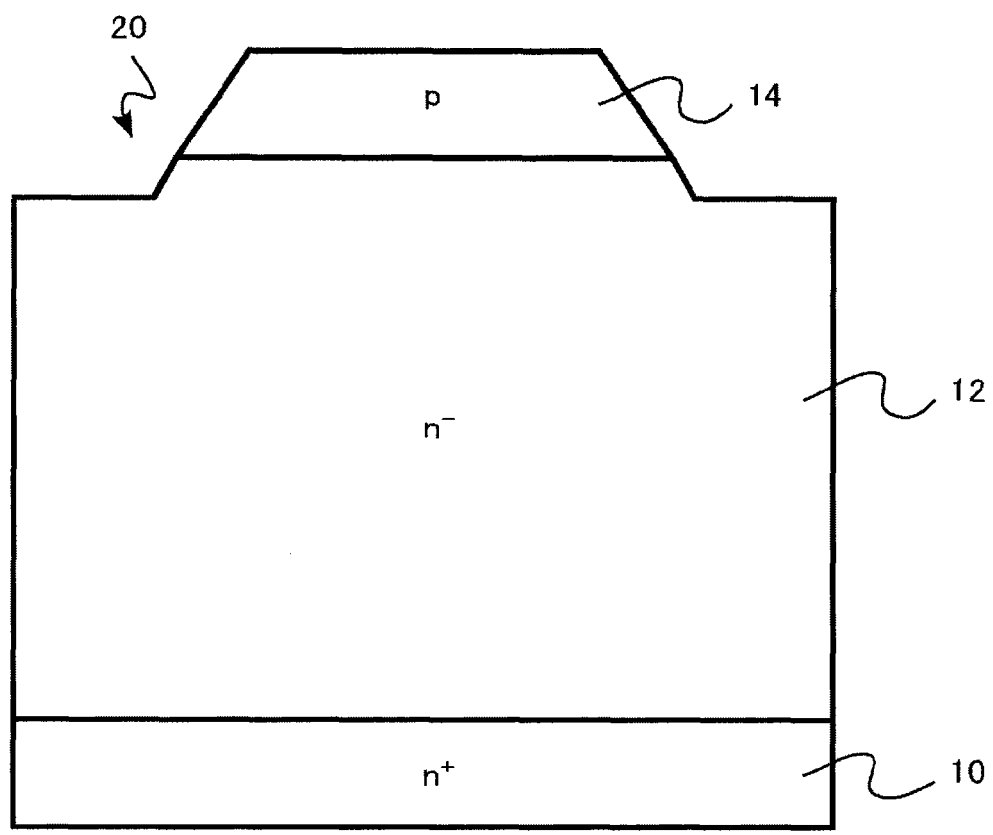
FIG. 4 is a schematic sectional view illustrating the semiconductor device during the manufacturing method of a semiconductor device according to the second embodiment.

The manufacturing method of a semiconductor device according to the present embodiment will be described next. FIGS. 3 and 4 are schematic sectional views illustrating a semiconductor device during the manufacturing method of a semiconductor device according to the present embodiment.

The process till the formation of the n type SiC layer 12 on the SiC substrate 10 is the same as the first embodiment, so that the description thereof is omitted.

Next, the p type SiC layer 14 is formed on the n type SiC layer 12 with an epitaxial growth process (FIG. 3). The p type SiC layer 14 is formed continuously with the n type SiC layer 12 in the same epitaxial growth device.

The source gas for Si (silicon) upon forming the p type SiC layer 14 is monosilane (SiH$_4$) using hydrogen gas (H$_2$) as carrier gas, for example. The source gas for C (carbon) is propane (C$_3$H$_8$) using hydrogen gas as carrier gas, for example. The source gas for N (nitrogen) that is the n type impurity is nitrogen gas (N$_2$) diluted with hydrogen gas, for example. The source gas for Al (aluminum) is trimethylaluminum (TMA) bubbled by hydrogen gas (H$_2$) and using hydrogen gas (H$_2$) as carrier gas.

Then, the trench 20 reaching the n type SiC layer 12 from the surface of the p type SiC layer 14 is formed by a known RIE (Reactive Ion Etching) process, for example (FIG. 4).

Thereafter, the anode electrode 16 is formed on the p type SiC layer 14, and the conductive cathode electrode 18 is formed on the back surface of the SiC substrate 10, by a known process. With the manufacturing method described above, the PIN diode 200 illustrated in FIG. 2 is formed.

With the manufacturing method of a semiconductor device according to the present embodiment, a carbon vacancy in the n type SiC layer 12 serving as a drift layer is reduced. Accordingly, the lifetime of holes in the n type SiC layer 12 is increased to realize the PIN diode 200 with a low on resistance.

Third Embodiment

A manufacturing method of a semiconductor device according to the present embodiment includes performing a first process and a second process alternately to form an n type SiC layer, the first process being performed to form a first SiC layer with an epitaxial growth process by using a first source gas containing an n type impurity, and the second process being performed to form a second SiC layer with an epitaxial growth process by using a second source gas containing an n type impurity, the second SiC layer being formed with a higher ratio (C/Si) between a number of atoms of C (carbon) and a number of atoms of Si (silicon) contained in the source gas than a ratio (C/Si) between a number of atoms of C (carbon) and a number of atoms of Si (silicon) contained in the source gas upon forming the first SiC layer, and with a thickness smaller than the thickness of the first SiC layer. Further, B (boron) is selectively implanted by ion implantation into the n type SiC layer to form p type SiC region.

A manufacturing method of a semiconductor device according to the present embodiment uses the manufacturing method of an SiC epitaxial substrate according to the first embodiment. Therefore, the description overlapping the first embodiment will not be repeated.

Figure 5:
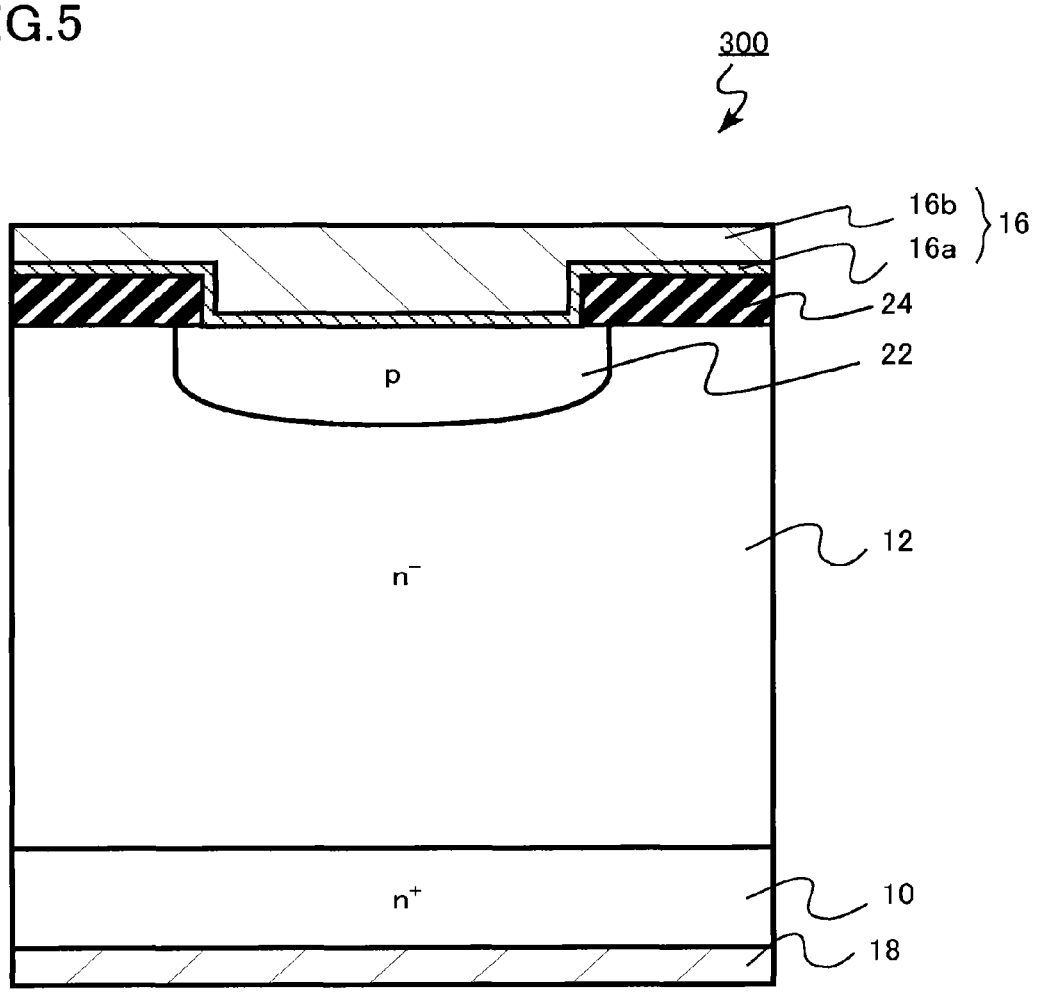
FIG. 5 is a schematic sectional view illustrating a semiconductor device manufactured by a manufacturing method of a semiconductor device according to a third embodiment.

FIG. 5 is a schematic sectional view illustrating a semiconductor device manufactured by the manufacturing method of a semiconductor device according to the present embodiment. A semiconductor device 300 according to the present embodiment is a PIN diode.

This PIN diode 300 includes an SiC substrate 10. The SiC substrate 10 is an n$^+$ single crystalline SiC substrate. For example, the SiC substrate 10 is a 4H-SiC substrate whose surface tilts at an off angle ranging from 0.2 degrees or more to 10 degrees or less from (0001) face.

An n type SiC layer 12 is formed on the SiC substrate 10. The n type SiC layer 12 is an epitaxial growth layer. The n type SiC layer 12 is a drift layer of the PIN diode 300.

The n type SiC layer 12 contains N (nitrogen) as an n type impurity, for example. The impurity concentration of the n type SiC layer 12 is $1 \times 10^{15}$ cm$^{-3}$ or more but $5 \times 10^{16}$ cm$^{-3}$ or less. The thickness of the n type SiC layer 12 is 5 μm or more but 100 μm or less, for example.

A p type SiC region 22 containing p type impurities is selectively formed on the surface of the n type SiC layer 12. The p type SiC region 22 is formed below an opening formed on an insulating film 24 on the surface of the n type SiC layer 12. The insulating film 24 is a silicon oxide film, for example.

The p type SiC region 22 contains B (boron) as a p type impurity, for example, and the impurity concentration is $1\times10^{16}$ cm$^{-3}$ or more but $1\times10^{22}$ cm$^{-3}$ or less. The depth of the p type SiC region 22 is 0.2 μm or more but 3 μm or less, for example.

The PIN diode 300 includes a conductive anode electrode 16 electrically connected to the p type SiC region 22. The anode electrode 16 includes an Ni (nickel) barrier metal layer 16a and an Al (aluminum) metal layer 16b on the barrier metal layer 16a.

A conductive cathode electrode 18 is formed on a back surface of the SiC substrate 10. The cathode electrode 18 is made of Ni (nickel), for example.

Figure 6:
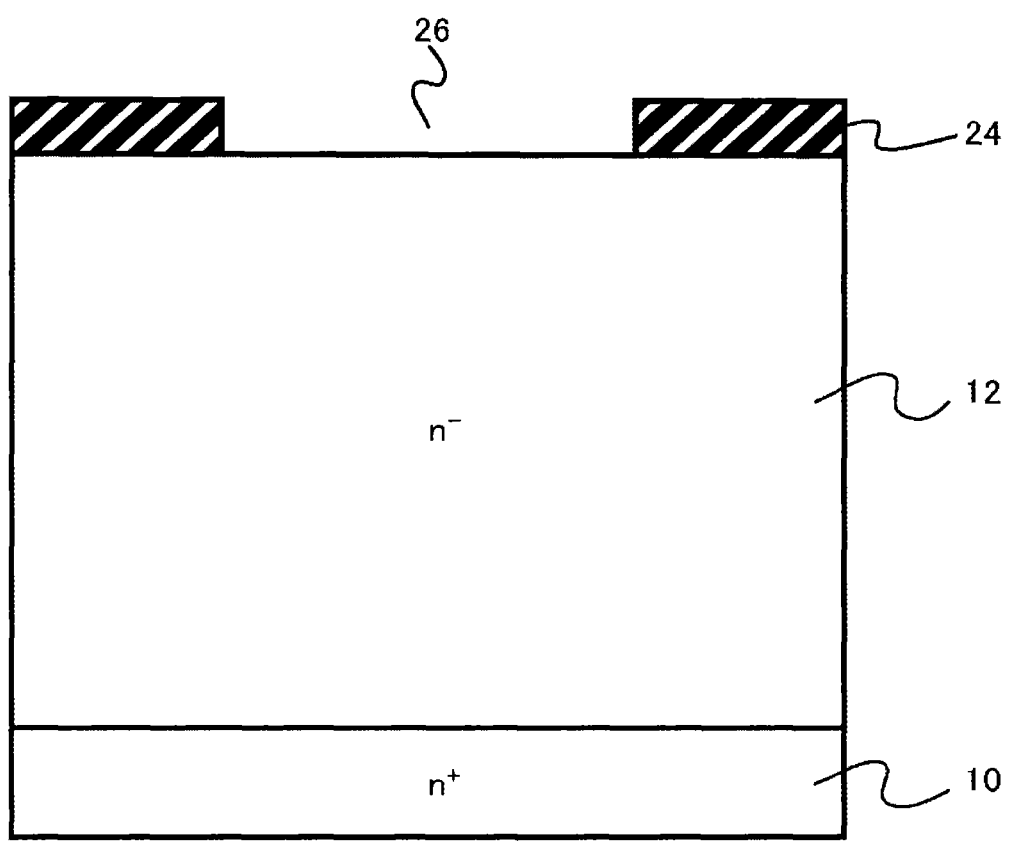
FIG. 6 is a schematic sectional view illustrating the semiconductor device during the manufacturing method of a semiconductor device according to the third embodiment.
Figure 7:
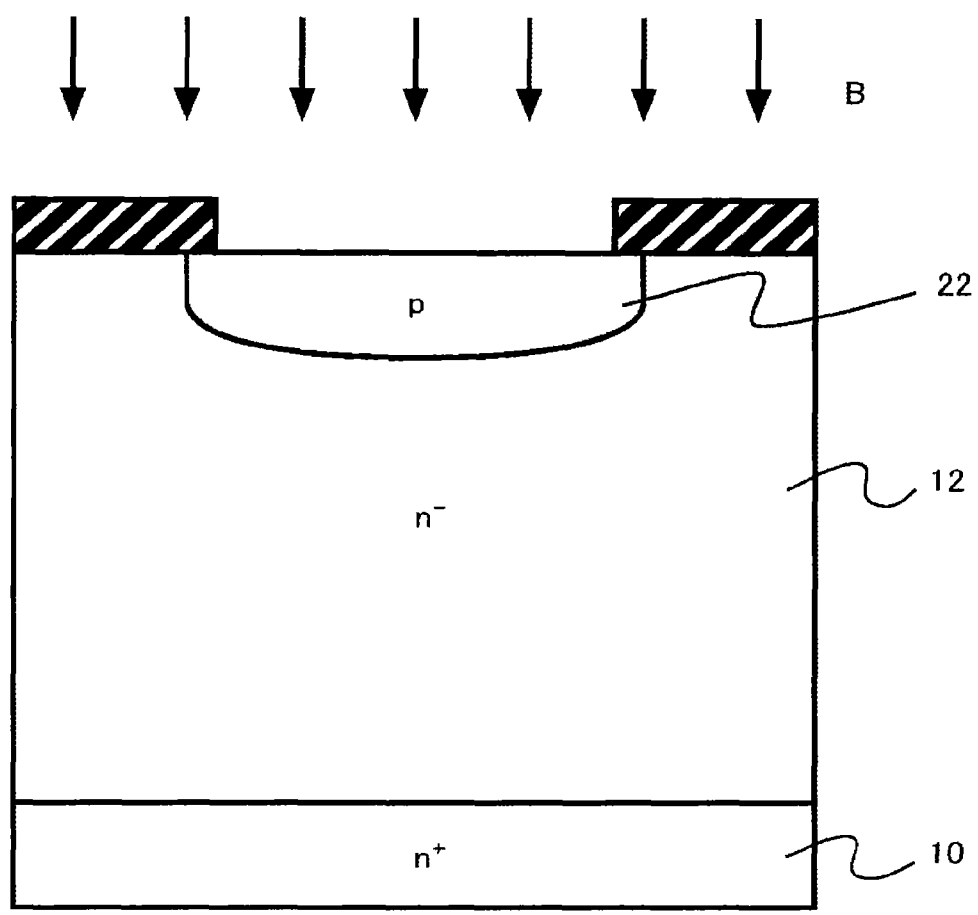
FIG. 7 is a schematic sectional view illustrating the semiconductor device during the manufacturing method of a semiconductor device according to the third embodiment.

The manufacturing method of a semiconductor device according to the present embodiment will be described next. FIGS. 6 and 7 are schematic sectional views illustrating a semiconductor device during the manufacturing method of a semiconductor device according to the present embodiment.

The process till the formation of the n type SiC layer 12 on the SiC substrate 10 is the same as the first embodiment, so that the description thereof is omitted.

Next, the insulating film 24 made of a silicon oxide film, for example, is formed on the n type SiC layer 12 with a CVD (Chemical Vapor Deposition) process, for example. Thereafter, a part of the insulating film 24 is selectively removed with a lithography process and RIE process, for example, to form an opening 26 (FIG. 6).

Then, B (boron) is selectively implanted by ion implantation into the n type SiC layer 12 from the opening 26 by using the insulating film 24 as a mask. The p type SiC region 22 is formed by the ion implantation of B (boron) (FIG. 7). Then, a heat treatment for activating B (boron) is performed.

Next, the anode electrode 16 is formed on the p type SiC region 22, and the cathode electrode 18 is formed on the back surface of the SiC substrate 10, by a known process. With the manufacturing method described above, the PIN diode 300 illustrated in FIG. 5 is formed.

The presence of a carbon vacancy increases a diffusion speed of B (boron) that is the p type impurity. Therefore, when B (boron) is used for forming the p type impurity region in the n type SiC, the formation of a stable impurity profile becomes difficult. Accordingly, Al (aluminum) with a low diffusion speed is generally used as the p type impurity.

A radius of ion of Al (aluminum) is greater than that of B (boron). Therefore, when Al (aluminum) is implanted into SiC by ion implantation, damage caused on SiC by the ion implantation is serious. This generates concern about deterioration in device characteristics, for example, such as an increase in leak current at PN junction.

According to the present embodiment, the carbon vacancy in the n type SiC layer 12 is reduced. Therefore, the increase in the diffusion speed is prevented, even if B (boron) is used as the p type impurity. Consequently, a stable impurity profile can be formed. Since B (boron) with a small ion radius is implanted by ion implantation, damage caused by the ion implantation is reduced, whereby the PIN diode 300 having excellent characteristics can be realized.

With the manufacturing method of a semiconductor device according to the present embodiment, a carbon vacancy in the n type SiC layer 12 serving as a drift layer is reduced. Accordingly, the lifetime of holes in the n type SiC layer 12 is increased, whereby the PIN diode 300 with a low on resistance can be realized. In addition, B (boron) is used as the p type impurity, whereby the PIN diode 300 having excellent characteristics can be realized.

Fourth Embodiment

The manufacturing method of a semiconductor device according to the present embodiment is the same as that of the third embodiment except that some of plural high-carbon-concentration SiC layers 12b are ultrahigh-carbon-concentration SiC layers 12c having a higher ratio (C/Si) between the number of atoms of C (carbon) and the number of atoms of Si (silicon) contained in the source gas than that of the high-carbon-concentration SiC layer 12b, and that a projected range (Rp) upon the ion implantation of B (boron) is set smaller than the depth of the ultrahigh-carbon-concentration SiC layer 12c. Therefore, the description overlapping the third embodiment will not be repeated.

Figure 8:
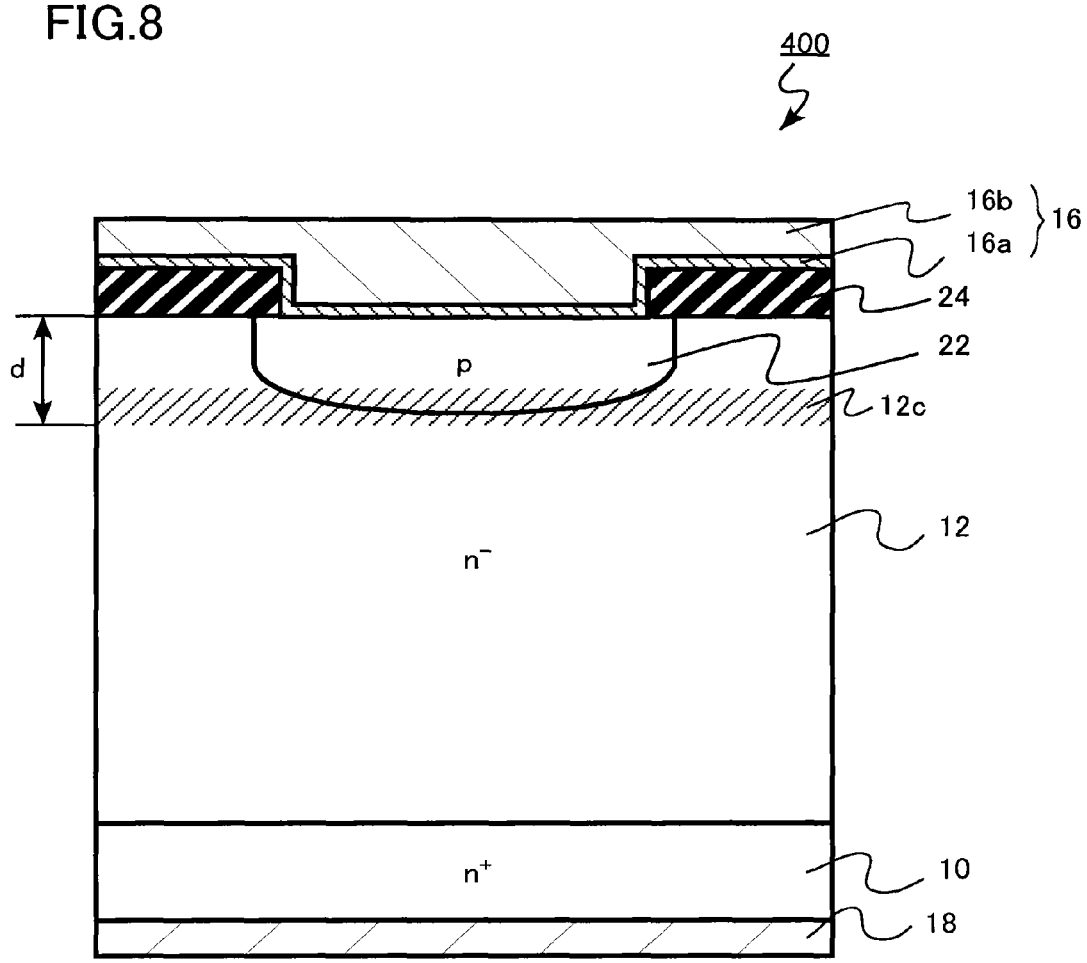
FIG. 8 is a schematic sectional view illustrating a semiconductor device manufactured by a manufacturing method of a semiconductor device according to a fourth embodiment.

FIG. 8 is a schematic sectional view illustrating a semiconductor device manufactured by the manufacturing method of a semiconductor device according to the present embodiment. A semiconductor device 400 according to the present embodiment is a PIN diode.

In this PIN diode 400, the ultrahigh-carbon-concentration SiC layer 12C is formed at the PN junction formed by the p type SiC region 22 and the n type SiC layer 12. The depth of the ultrahigh-carbon-concentration SiC layer 12C is represented by "d" in FIG. 8.

Figure 9:
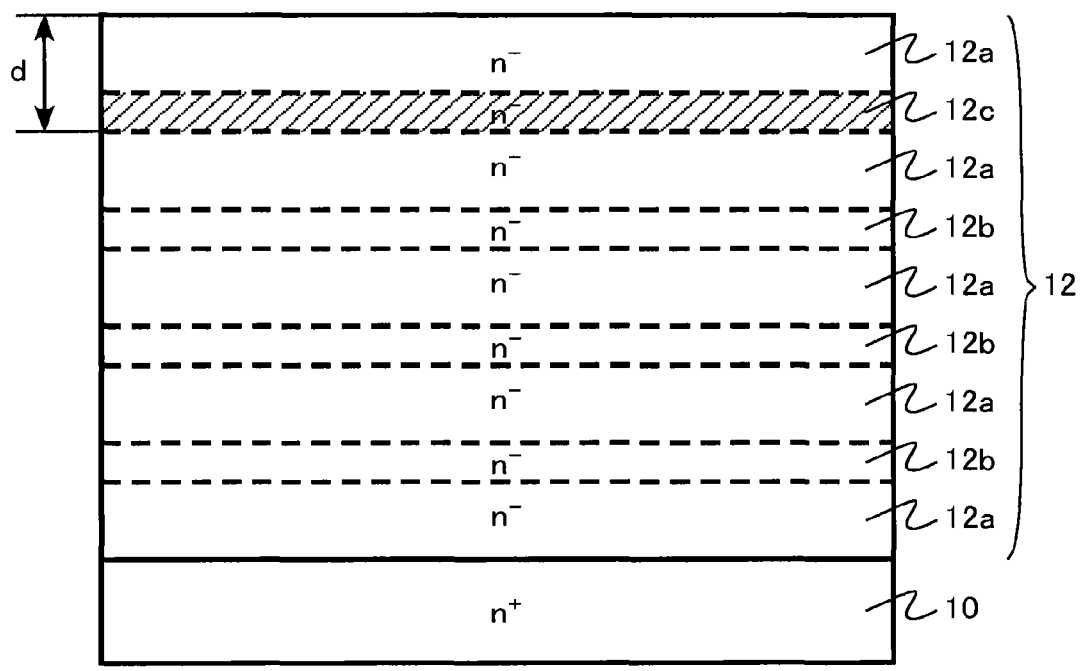
FIG. 9 is a schematic sectional view illustrating the semiconductor device during the manufacturing method of a semiconductor device according to the fourth embodiment.

The manufacturing method of a semiconductor device according to the present embodiment will be described next. FIG. 9 is a schematic sectional view illustrating a semiconductor device during the manufacturing method of a semiconductor device according to the present embodiment.

Differently from the first embodiment, some of the plural high-carbon-concentration SiC layers 12b are formed as the ultrahigh-carbon-concentration SiC layer 12c having a higher ratio (C/Si) between the number of atoms of C (carbon) and the number of atoms of Si (silicon) contained in the source gas than that of the high-carbon-concentration SiC layer 12b, upon forming the n type SiC layer 12 on the SiC substrate 10. In the present embodiment, the uppermost high-carbon-concentration layer is formed as the ultrahigh-carbon-concentration SiC layer 12c. The depth of the ultrahigh-carbon-concentration SiC layer 12c is represented by "d" in FIG. 8.

In the present embodiment, the ultrahigh-carbon-concentration SiC layer 12c has high carbon concentration, and the ultrahigh-carbon-concentration SiC layer 12c is formed at an upper part of the n type SiC layer 12, whereby thermal energy applied after the formation of the ultrahigh-carbon-concentration SiC layer 12c is relatively small. Accordingly, this layer remains as a region with a high carbon concentration, even after the formation of the n type SiC layer 12.

When B (boron) is selectively implanted by ion implantation into the n type SiC layer 12 from the opening 26 by using the insulating film 24 as a mask, the projected range (Rp) is set smaller than the depth of the ultrahigh-carbon-concentration SiC layer 12c. Especially, the projected range (Rp) is desirably set to be located in the ultrahigh-carbon-concentration SiC layer 12c.

Thereafter, a heat treatment for activation is performed. Then, the anode electrode 16 is formed on the p type SiC region 22, and the cathode electrode 18 is formed on the back surface of the SiC substrate 10.

With the manufacturing method described above, the PIN diode 400 illustrated in FIG. 8 is formed.

A carbon vacancy is further small in the ultrahigh-carbon-concentration SiC layer 12c. Therefore, the diffusion speed of B (boron) that is the p type impurity is further reduced. With this, the ultrahigh-carbon-concentration SiC layer 12c becomes a stopper against the diffusion of B (boron) in the p type SiC region 22, whereby a more stable impurity profile can be formed.

With the manufacturing method of a semiconductor device according to the present embodiment, a carbon vacancy in the n type SiC layer 12 serving as a drift layer is reduced. Accordingly, the lifetime of holes in the n type SiC layer 12 is increased to realize the PIN diode 400 with a low on resistance. In addition, since the ultrahigh-carbon-concentration SiC layer 12c that becomes the stopper against the diffusion of B (boron) is formed, the PIN diode 400 having more excellent characteristics can be realized.

In the embodiments described above, a structure of 4H-SiC has been described as an example of a crystal structure of silicon carbide. However, the embodiments are applicable to silicon carbide having other crystal structures, such as 6H-SiC or 3C-SiC.

A PIN diode has been described as a bipolar device in the embodiments. However, the embodiments are applicable to other bipolar devices, such as IGBT (Insulated Gate Bipolar Transistor) or BJT (Bipolar Junction Transistor), so long as it uses an n type SiC layer as a drift layer.

While certain embodiments have been described, these embodiments have been presented by way of example only, and are not intended to limit the scope of the inventions. Indeed, the manufacturing method of an SiC epitaxial substrate, the manufacturing method of a semiconductor device, and the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A manufacturing method of an SiC epitaxial substrate comprising:
    performing a first process and a second process alternately to form an n type SiC layer,
    the first process forming a first SiC layer with an epitaxial growth process by using a first source gas containing an n type impurity, and
    the second process forming a second SiC layer with an epitaxial growth process by using a second source gas containing the n type impurity, the second source gas having a higher atomic ratio between C (carbon) and Si (silicon) (C/Si) than that of the first source gas, a thickness of the second SiC layer being smaller than a thickness of the first SiC layer.

2. The method according to claim 1, wherein
    the atomic ratio (C/Si) in the first source gas is 0.9 or more but 1.2 or less, and
    the atomic ratio (C/Si) in the second source gas is 1.5 or more but 2.5 or less.

3. The method according to claim 1, wherein
    a growth speed of the second SiC layer is lower than a growth speed of the first SiC layer.

4. The method according to claim 1, wherein
    the atomic ratio (C/Si) in the second source gas is larger than 2.0.

5. The method according to claim 1, wherein
    an amount of the n type impurity contained in the second source gas is larger than an amount of the n type impurity contained in the first source gas.

6. The method according to claim 1, wherein
    the thickness of the second SiC layer is 0.1 μm or more but 2 μm or less.

7. A manufacturing method of a semiconductor device comprising:
    performing a first process and a second process alternately to form an n type SiC layer,
    the first process forming a first SiC layer with an epitaxial growth process by using a first source gas containing an n type impurity, and
    the second process forming a second SiC layer with an epitaxial growth process by using a second source gas containing the n type impurity, the second source gas having a higher atomic ratio between C (carbon) and Si (silicon) (C/Si) than that of the first source gas, a thickness of the second SiC layer being smaller than a thickness of the first SiC layer.

8. The method according to claim 7, wherein
    a p type SiC layer containing a p type impurity is formed on the n type SiC layer with an epitaxial growth process.

9. The method according to claim 7, wherein
    B (boron) is selectively implanted by ion implantation into the n type SiC layer to form a p type SiC region.

10. A semiconductor device manufactured by performing a first process and a second process alternately to form an n type SiC layer,
    the first process forming a first SiC layer with an epitaxial growth process by using a first source gas containing an n type impurity, and
    the second process forming a second SiC layer with an epitaxial growth process by using a second source gas containing the n type impurity, the second source gas having a higher atomic ratio between C (carbon) and Si (silicon) (C/Si) than that of the first source gas, a thickness of the second SiC layer being smaller than that of a thickness of the first SiC layer.

* * * * *